(12) United States Patent
Martens et al.

(10) Patent No.: US 10,008,251 B2
(45) Date of Patent: Jun. 26, 2018

(54) MAGNETIC MEMORY HAVING MULTIPLE GATES AND METHOD OF OPERATING SAME

(71) Applicants: IMEC VZW, Leuven (BE); Katholieke Universiteit Leuven, Leuven (BE)

(72) Inventors: Koen Martens, Ghent (BE); Adrien Vaysset, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days. days.

(21) Appl. No.: 15/597,056

(22) Filed: May 16, 2017

(65) Prior Publication Data
US 2017/0301383 A1     Oct. 19, 2017

Related U.S. Application Data

(63) Continuation of application No. PCT/EP2015/076759, filed on Nov. 17, 2015.

(30) Foreign Application Priority Data

Nov. 17, 2014  (EP) .................................. 14193443

(51) Int. Cl.
*G11C 11/16* (2006.01)
*G11C 11/15* (2006.01)
*H01L 43/08* (2006.01)

(52) U.S. Cl.
CPC .......... *G11C 11/1675* (2013.01); *G11C 11/15* (2013.01); *G11C 11/161* (2013.01); *H01L 43/08* (2013.01)

(58) Field of Classification Search
CPC ............................ G11C 11/16; G11C 11/1675
(Continued)

(56) References Cited

U.S. PATENT DOCUMENTS 6,710,984 B1 * 3/2004 Yuasa .................... B82Y 10/00
                                                      360/324.11
6,716,537 B1 * 4/2004 Kakihara ............... B82Y 10/00
                                                      360/324.1
(Continued)

FOREIGN PATENT DOCUMENTS

EP           1 610 391 A2    12/2005
WO    WO 2016/079085 A1     5/2016

OTHER PUBLICATIONS

Alzate, J.G. et al., "Voltage-Induced Switching of Nanoscale Magnetic Tunnel Junctions," Electron Devices Meeting (IEDM), pp. 29.5.1-29.5.4; 2012.
(Continued)

*Primary Examiner* — Michael Tran
(74) *Attorney, Agent, or Firm* — Knobbe, Martens, Olson & Bear LLP

(57) ABSTRACT

The disclosed technology generally relates to magnetic memory and more particularly to voltage-controlled magnetic memory, and to methods of using same. In one aspect, a magnetic memory comprises a first magnetic stack including a first gate dielectric layer formed between a first gate electrode and a first free ferromagnetic layer. The magnetic memory additionally comprises a second magnetic stack including a second gate dielectric layer formed between a second gate electrode and a second free ferromagnetic layer. The first free ferromagnetic layer and the second free ferromagnetic layer of the magnetic memory are magnetically coupled, contiguous and are positioned at an oblique angle relative to each other, and the first gate electrode and the second gate electrode are electrically isolated from each other.

16 Claims, 8 Drawing Sheets

(58) Field of Classification Search
USPC .................................................. 365/158, 173
See application file for complete search history.

(56) References Cited

U.S. PATENT DOCUMENTS

| | | | | | |
|---|---|---|---|---|---|
| 6,958,930 | B2* | 10/2005 | Johnson | ................ | G01R 33/06 257/295 |
| 7,936,028 | B2* | 5/2011 | Hong | ................ | H01L 29/66984 257/295 |
| 8,179,716 | B2* | 5/2012 | Xi | ................ | H03K 19/173 365/158 |
| 8,779,496 | B2* | 7/2014 | Saito | ................ | B82Y 10/00 257/213 |
| 9,123,875 | B2* | 9/2015 | Deak | ................ | B82Y 25/00 |
| 2002/0102351 | A1* | 8/2002 | Noguchi | ............ | G11B 5/70678 427/128 |
| 2003/0086217 | A1* | 5/2003 | Pinarbasi | ................ | B82Y 10/00 360/324.12 |
| 2003/0151944 | A1 | 8/2003 | Saito | | |
| 2003/0189801 | A1* | 10/2003 | Dovek | ................ | B82Y 10/00 360/324.12 |
| 2005/0282379 | A1 | 12/2005 | Saito et al. | | |
| 2006/0180839 | A1* | 8/2006 | Fukumoto | ............ | B82Y 25/00 257/295 |
| 2007/0274009 | A1* | 11/2007 | Hoshino | ................ | B82Y 10/00 360/313 |
| 2009/0109734 | A1* | 4/2009 | Hanafi | ................ | G11C 11/412 365/158 |
| 2010/0157662 | A1* | 6/2010 | Ono | ................ | B82Y 10/00 365/158 |
| 2012/0038387 | A1* | 2/2012 | Nikonov | ................ | B82Y 25/00 326/35 |
| 2013/0149559 | A1* | 6/2013 | Covington | ............ | B82Y 10/00 428/816 |
| 2014/0004386 | A1* | 1/2014 | Covington | ............ | G11B 5/3932 428/816 |
| 2015/0147481 | A1* | 5/2015 | Braganca | ................ | C25D 5/48 427/529 |

OTHER PUBLICATIONS

International Search Report and Written Opinion dated Feb. 2, 2016 in International Patent Application No. PCT/EP2015/076759; 16 pages.

Morosov, A.I, et al., "'Long Leg' Magnetoelectric Memory," Journal of Applied Physics, vol. 115, No. 22; 2014; 4 pages.

* cited by examiner

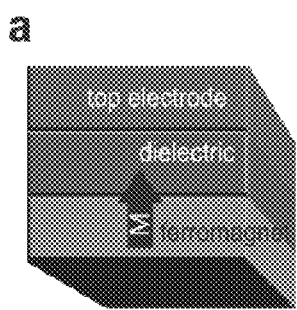 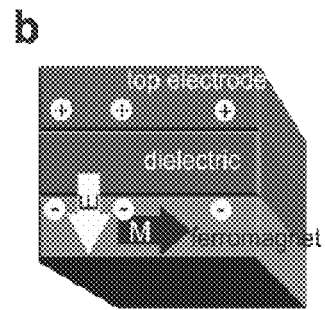 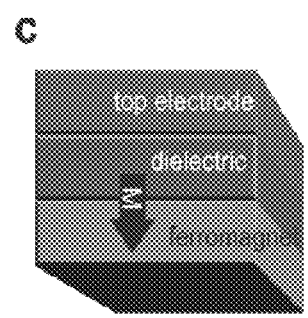
FIG. 1A　　　　FIG. 1B　　　　FIG. 1C
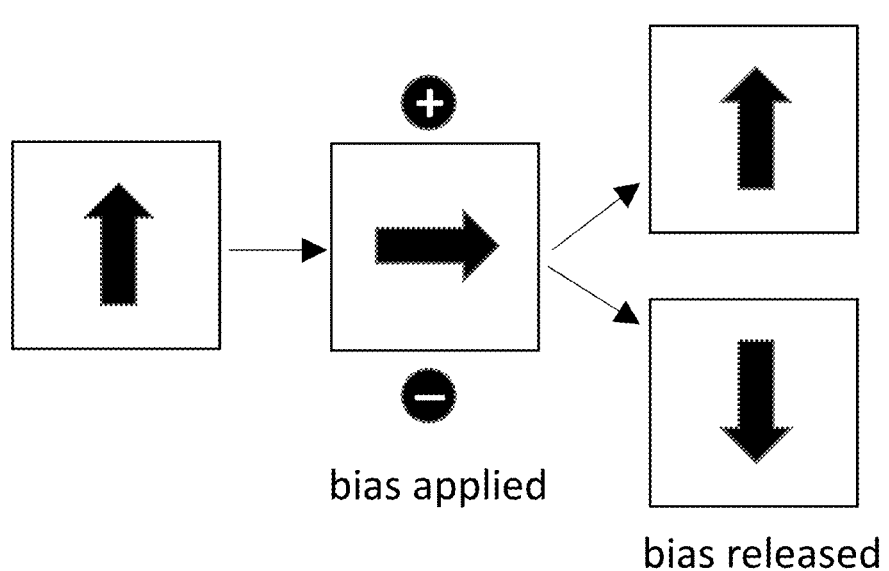
FIG. 2A　　　　FIG. 2B　　　　FIG. 2C

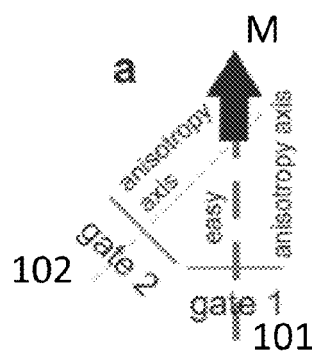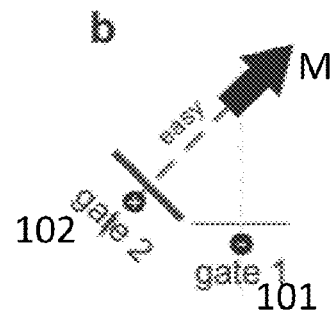
FIG. 5A  FIG. 5B
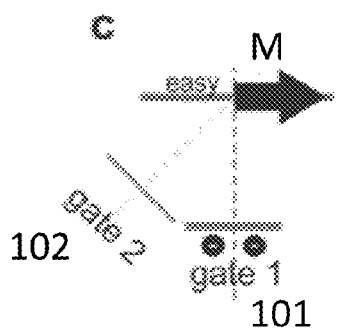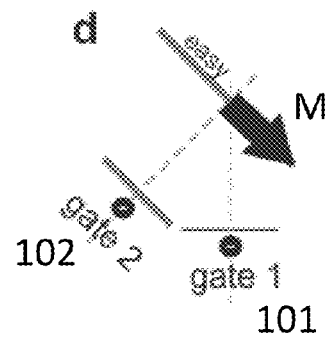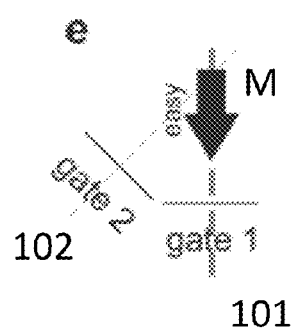
FIG. 5C  FIG. 5D  FIG. 5E

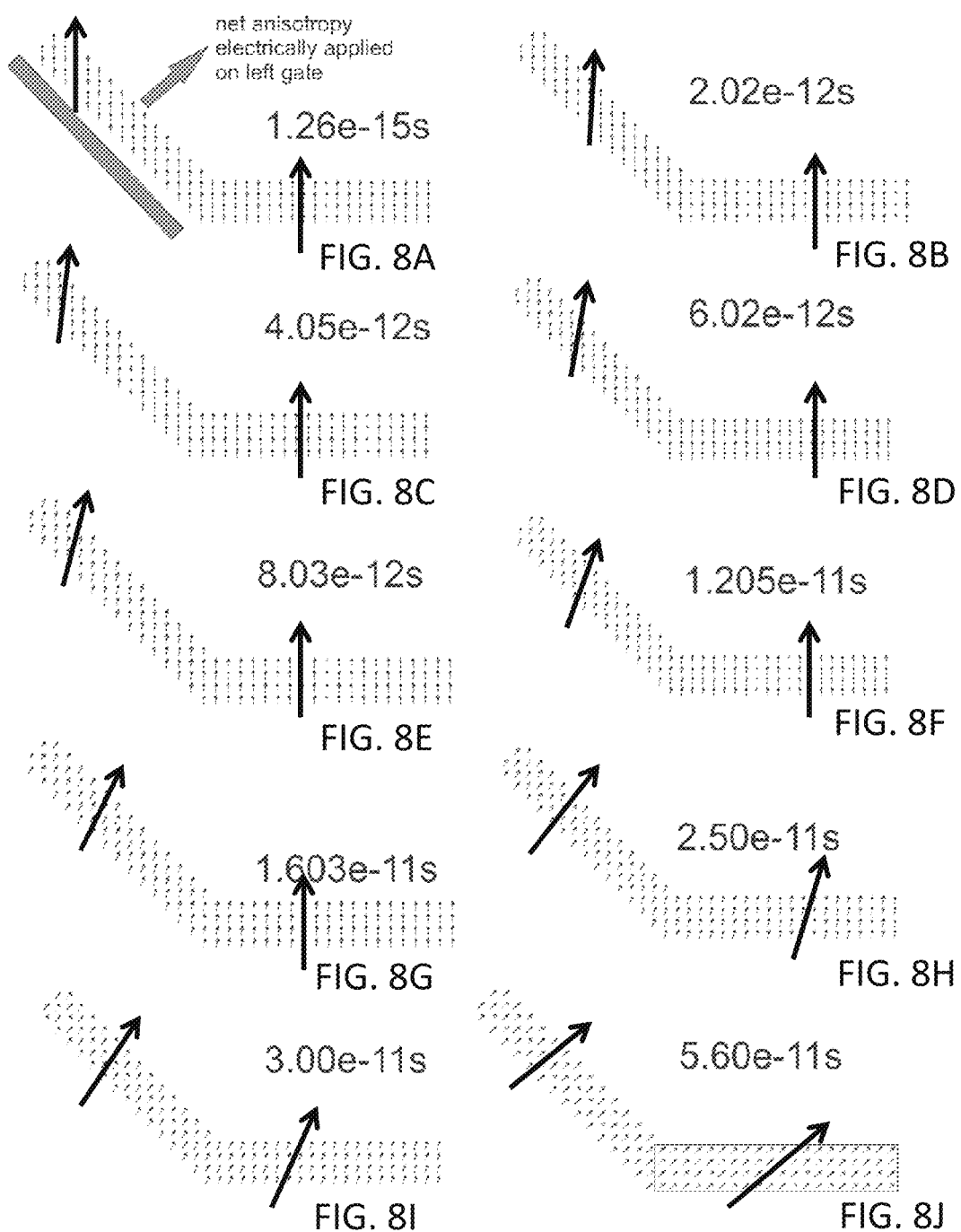

MAGNETIC MEMORY HAVING MULTIPLE GATES AND METHOD OF OPERATING SAME

CROSS-REFERENCE TO RELATED APPLICATIONS

This application is a continuation of PCT Application No. PCT/EP2015/076759, filed on Nov. 17, 2015, which claims priority to European Patent Application No. EP 14193443.0, filed on Nov. 17, 2014. Each of the above applications is incorporated herein by reference in its entirety.

BACKGROUND

Field

The disclosed technology generally relates to magnetic memory and more particularly to voltage-controlled magnetic memory, and to method of using same.

Description of the Related Technology

The voltage controlled magnetic anisotropy (VCMA) effect has been described to be an interfacial effect, in which an electric field at the interface of a dielectric and a ferromagnet causes the magnetocrystalline anisotropy of the ferromagnet to be modified. The effect typically results in a change in the uniaxial anisotropy parameter ($K_u$) of a thin film ferromagnet. The effect can result in a change of easy-axis ($K_u$>0) to easy-plane ($K_u$<0) or vice versa, and consequently a change of magnetization direction.

The VCMA effect is for example described in an article entitled "Voltage-induced switching of nanoscale magnetic tunnel junctions" from Alzate et al., published in Electron Devices Meeting (IEDM), 2012 IEEE, International, pages 29.5.1-29.5.4.

However, increasing the efficiency and speed of switching in magnetic memory devices, including those configured to switch using the VCMA effect, remain a challenge.

SUMMARY OF CERTAIN INVENTIVE ASPECTS

According to a first inventive aspect a magnetic memory element is disclosed comprising a first magnetic stack comprising a first gate dielectric layer 201 sandwiched in between a first gate electrode 101 and a first free ferromagnetic layer 701; a second magnetic stack comprising a second gate dielectric layer 202 sandwiched in between a second gate electrode 102 and a second free ferromagnetic layer 702; the first free ferromagnetic layer 701 and the second free ferromagnetic layer 702 being magnetically coupled, being contiguous and being positioned at an oblique angle 800 relative to each other; the first gate electrode 101 and the second gate electrode 102 being electrically isolated from each other.

According to embodiments of the first inventive aspect, the first free ferromagnetic layer 701 and the second free ferromagnetic layer 702 comprise the same ferromagnetic material stack or comprise two different ferromagnetic materials stacks.

According to embodiments of the first inventive aspect, the first gate dielectric layer 201 and the second gate dielectric layer 202 are also contiguous and at the oblique angle 800 from each other.

According to embodiments of the first inventive aspect, the first gate electrode 101 and the second gate electrode 102 are electrically isolated from each other. The first gate electrode 101 and the second gate electrode 102 may be electrically isolated by the first gate dielectric layer 201 or the second gate dielectric layer 202.

According to embodiments of the first inventive aspect, the angle 800 is oblique, which means not parallel or normal (so not 0 degrees+n times 90 degrees, with n being a natural number). The angle may be the preferable angle of 45 degrees+n times 90, with n being a natural number.

According to embodiments, the fixed ferromagnetic layer 900 may be identical or part of one or both of the gate electrodes 101 and/or 102 and the barrier layer 90 may be identical to or part of the dielectric layers 202 or 201.

According to embodiments, the first gate electrode and second gate electrode are stacked over a substrate in a vertical direction and are interposed by the first gate dielectric layer in the vertical direction.

According to embodiments, the second gate electrode comprises a facet having a normal direction which forms the oblique angle with respect to the vertical direction.

According to embodiments, the first and second free ferromagnetic layers are portions of the same ferromagnetic layer.

According to embodiments, the facet of the second gate electrode and the second free ferromagnetic layer are interposed by the second dielectric layer.

According to embodiments, the first and second dielectric layers are formed of MgO having a thickness less than 2 nm.

According to a second inventive aspect a voltage-controlled magnetic anisotropy (VCMA) device is disclosed comprising the magnetic memory element according to embodiments, wherein the magnetic anisotropy of the first magnetic stack may be controlled by voltages applied to the first gate electrode 101 and wherein the magnetic anisotropy of the second magnetic stack may be controlled by voltages applied to the second gate electrode 102 which can be used to give rise to a switch of the magnetization orientation of the free ferromagnetic layer 701,702.

According to embodiments of the second inventive aspect, the first magnetic gate stack may possess a sufficiently large perpendicular magnetic anisotropy for nonvolatile storage of a bit whereas the second magnetic stack may possess a small or negligible anisotropy for the device at rest. In this case no voltages are applied to the first and second gate electrode at rest and the bit of the memory element is nonvolatile.

According to embodiments of the second inventive aspect the voltage-controlled magnetic anisotropy (VCMA) device may further comprise a fixed ferromagnetic layer 900, situated on top or beneath the first free ferromagnetic layer 701 and/or the second free ferromagnetic layer 702 with a barrier layer 901 in between the fixed ferromagnetic layer 900 and the first free ferromagnetic layer 701 and/or the second free ferromagnetic layer 702, wherein the combination of the fixed ferromagnetic layer 900, the insulating barrier layer 901 and the first 701 and/or second 702 free ferromagnetic layer serves the function to read out the memory by means of Tunneling Magnetoresistance (TMR) effect. The fixed ferromagnetic layer 900 may be identical or part of one or both of the gate electrodes 101 and/or 102 and the barrier layer 90 may be identical to or part of the dielectric layers 202 or 201. The barrier layer may be an insulating layer.

According to a third inventive aspect a method for reversing the bit of a voltage-controlled magnetic anisotropy (VCMA) device according to embodiments of the present invention is disclosed, the method comprising the steps of applying a first set of voltages simultaneously to the first and second gate electrode for rotating the magnetization by approximately 45 degrees or an oblique angle between 0 and 90 degrees; applying a second set of voltages simultaneously to the first and second gate electrode for rotating the magnetization by approximately another 45 degrees or the complement of the previous oblique angle; resulting in a total rotation of magnetization of approximately 90 degrees relative to the initial magnetization orientation. Next, a third set of voltages is applied to the gates so the magnetization rotates by a further 45 degrees or another oblique angle. Finally, the voltages to the first and second gate electrodes are set to their initial values. After this last step the magnetization has rotated by approximately 180 degrees compared to the initial situation and the magnetic bit is now reversed.

According to the third inventive aspect the voltages on the gates do not necessarily need to be constant for a certain time needed to reorient the magnetization but can vary during the switching time the average value during that time corresponding to the voltage described in the method above. For example, the voltage in function of time could be sinusoidal or trapezoidal.

According to embodiments of the third inventive aspect applying a first set of voltages simultaneously to the first and second gate electrode may induce the anisotropy of the second magnetic stack to become large and perpendicular whereas the anisotropy of the first magnetic stack is induced to be small and wherein applying a second set of voltages simultaneously to the first and second gate electrode induces changing the anisotropy of the first gate magnetic stack to become large and in-plane and changing the anisotropy of the second gate magnetic stack to become small. The third set of voltages is applied to the gates may then induce the anisotropy of the first stack to become small and negligible and the anisotropy of the second stack to become large and in-plane. Finally in this scenario, when the voltages are released and set to zero, the first ferromagnetic electrode is returned to its initial strong perpendicular anisotropy whereas the second to its initial weak anisotropy.

According to embodiments a method for reading the bit of a voltage-controlled magnetic anisotropy (VCMA) device according to preferred embodiments is disclosed, the method comprising measuring the resistance between the first free ferromagnetic electrode and the fixed ferromagnetic electrode.

BRIEF DESCRIPTION OF THE DRAWINGS

All drawings are intended to illustrate some aspects and embodiments of the present disclosure. The drawings described are only schematic and are non-limiting.

FIGS. 1A-1C schematically illustrate a voltage-controlled magnetic anisotropy (VCMA) effect.

FIGS. 2A-2C illustrates the symmetry issue of the VCMA effect.

FIGS. 5A-5E schematically illustrate the VCMA switching behavior for a magnetic memory element according to embodiments of the disclosed technology.

FIGS. 8A-8J show a more elaborate schematic representation of the VCMA switching behavior for a magnetic memory element according to embodiments of the disclosed technology. The double-headed arrow indicates the easy axis or easy plane. The large arrows marked with M represent the magnetization direction.

DETAILED DESCRIPTION OF CERTAIN ILLUSTRATIVE EMBODIMENTS

Figure 3:
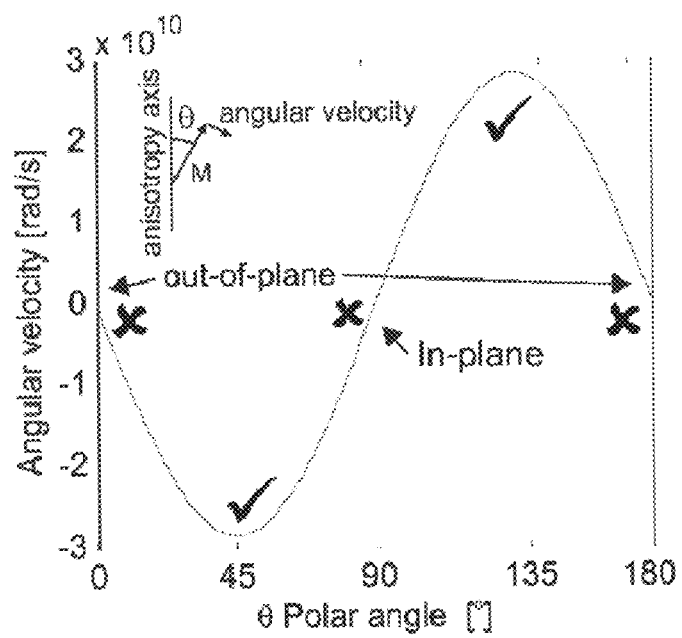
FIG. 3 illustrates the speed issue of switching by means of anisotropy torque.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

For a ferromagnetic film, an easy axis is associated with the anisotropy parameter Ku when it is larger than 0. In this case, the easy axis is the same as the anisotropy axis. The anisotropy axis is perpendicular to the plane of the magnetic film. When Ku is smaller than 0, there is no associated easy axis, but instead an associated easy plane. The easy plane is perpendicular to the anisotropy axis, which stays the same for Ku smaller than 0.

FIGS. 1A-1C schematically illustrate the VCMA effect. FIG. 1A illustrates a magnetic stack comprising a dielectric layer sandwiched in between an electrode layer and a ferromagnetic layer with an out-of-plane easy axis linked with a magnetization M. Application of an electric field (E)

(FIG. 1B) at the ferromagnet-dielectric interface results in an anisotropy change (out-of-plane easy axis or perpendicular anisotropy changes to an easy plane or in-plane anisotropy (FIG. 1A→FIG. 1B)), resulting in a change of magnetization (M) direction. When the field is released (FIG. 1C), the effect can be used to flip the magnetization and state of a memory bit determined by an up or down state. Without being bound to any theory, this effect is frequently ascribed to a change in d-orbital occupation.

The magnetic memory element according to the disclosure addresses the symmetry issue of voltage controlled magnetic memory and makes it possible to operate at lower power and at higher speeds compared to present-day spintronic memory devices, such as, e.g., spin torque transfer (STT) MRAM. The symmetry of the VCMA effect of the magnetic memory element according to the disclosure results in non-deterministic or non-reversible and non-precessional magnetization switching. The magnetic memory element according to the disclosure has the advantage to be able to break the VCMA effect symmetry and allows to deterministically and reversibly switch magnetization by 180° within switching times less than about 1 ns.

According to embodiments described herein, both challenges (i.e., breaking the symmetry of the VCMA effect and realizing fast switching of the magnetization (in less than 1 ns)) are strongly related to the uniaxial anisotropy that is modulated by the VCMA effect. Switching speeds down to 100-200 ps can be achieved for the double gate VCMA device. When manipulating a memory bit with the VCMA effect, steady-state magnetization at zero magnetic field will either be along the anisotropy axis (which is perpendicular to the plane of the magnetic film) or in a plane perpendicular to the anisotropy axis. The typical VCMA effect by itself does not allow deterministic flipping of magnetization by 180°, which is sufficient for non-volatile information storage. This is illustrated in FIGS. 2A-2C. In this example, a bias is applied (FIG. 2B) resulting in VCMA-based switching of the magnetization from out-of-plane (FIG. 2A) to in-plane (FIG. 2B). When the bias is released (FIG. 2C), the easy-axis is out-of plane and there is approximately a 50/50 chance of the magnetization ending in either the up or down state due to the stochastic nature of this switching process. When applying a constant bias magnetic field (e.g. Oersted, stray field, or through exchange bias), the bit (which is linked to the direction of the magnetization) can switch back to the same value and not retain a memory functionality.

FIG. 3 is a graph illustrating the speed issue of switching by means of anisotropy torque. As illustrated, the angular velocity is highest at θ=45°, which is not an orientation common in thin film devices (which can typically be 0°, 90°, . . . ), with θ being the polar angle between the anisotropy axis and the magnetization as illustrated in the inset. The modulation of uniaxial anisotropy results, as a result, in slow switching because the anisotropy field torque and angular velocity is minimal for the in-plane and out-of-plane orientations (as shown in FIG. 3), which are the starting magnetization orientations for a switching process in a typical thin film VCMA device. In current prior art spintronic STT-MRAMs, high power consumption is typically caused by high MAcm$^{-2}$ spin torque transfer (STT) currents. The main benefit of the magnetic memory element according to the present disclosure is a reduction of the current levels by orders of magnitude and rendering the spintronic memory sufficiently fast for level 1 SRAM.

To address the above and other issues, different embodiments of the disclosed technology include a magnetic memory element in which the memory bit value can be effectively changed by means of voltage controlled magnetic anisotropy.

According to various embodiments, a magnetic memory cell comprises at least two gate electrodes and at least one contiguous ferromagnetic layer in which the magnetization direction (which can be determined by applying voltages to the at least two gates) determines the memory bit value.

The magnetic memory cell according to various embodiments comprises thus at least two magnetic stacks each comprising a gate dielectric layer sandwiched in between a gate electrode layer and a ferromagnetic electrode layer. The gate dielectric/ferromagnetic interfaces of both stacks are contiguous and formed at an oblique angle from one another. According to embodiments, the ferromagnetic layers of the at least two magnetic stacks may be a shared contiguous ferromagnetic electrode.

Each gate electrode layer is separated from the corresponding ferromagnetic electrode layer by a gate dielectric layer. As configured, the voltage between the ferromagnetic electrode and the gate electrode can determine the field at the dielectric/ferromagnet interface, which co-determines the ferromagnet anisotropy.

Figure 4:
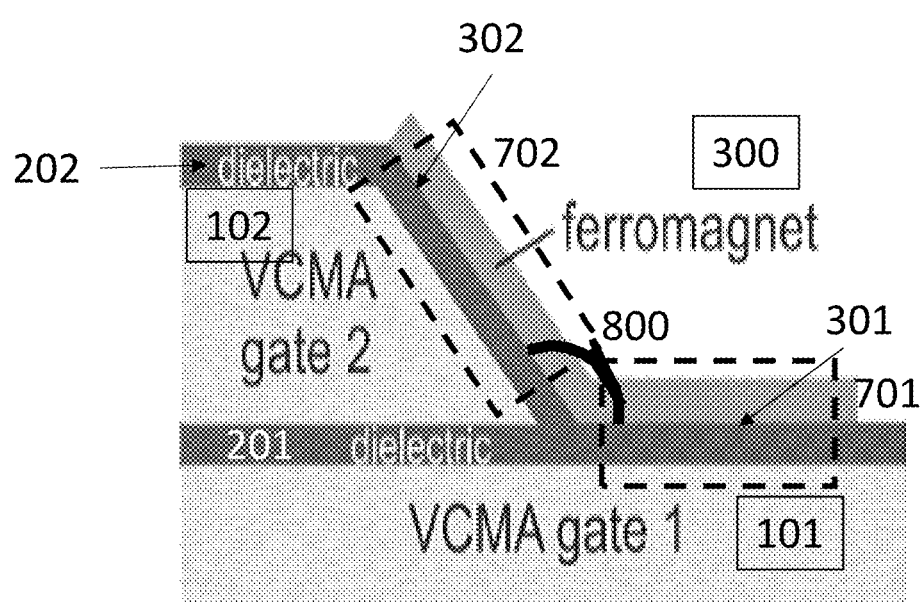
FIG. 4 shows an example of a magnetic memory element according to embodiments of the present disclosure.

FIG. 4 illustrates a magnetic memory element according to the present disclosure. The magnetic memory element comprises at least two magnetic stacks 701, 702. Each magnetic stack comprises a gate dielectric layer 201, 202 sandwiched in between a gate electrode 101, 102 and a corresponding ferromagnetic layer 300. In the illustrated embodiment, the ferromagnetic layer 300 is illustrated as a shared contiguous ferromagnetic layer. In FIG. 4, the magnetic memory element may comprise thus a first ferromagnetic layer corresponding to the first magnetic gate stack and a second ferromagnetic layer corresponding to the second magnetic gate stack, in which the ferromagnetic layer 300 is contiguous. the first interface 301 between the first gate dielectric layer 201 and the (first) ferromagnetic layer 701 and the second interface 302 between the second gate dielectric layer 202 and the (second) ferromagnetic layer 702 are contiguous and at an oblique angle 800 from each other. That is, the first and second ferromagnetic layers corresponding to the two magnetic stacks 701, 702 contact, e.g., physically contact, each other at an oblique angle from each other. If a shared ferromagnetic layer is used, this ferromagnetic layer is thus angulated with an oblique angle between a first and a second part. However, embodiments are not so limited, and in other implementations, the ferromagnetic layer 300 may be physically separated, while being electrically connected, e.g., electrically connected in parallel. In the illustrated embodiment, Different device embodiments can realize a multiple gate VCMA device. The disclosed devices utilize scaled ferromagnetic film thicknesses (typically 0.5-2 nm) to allow for dominant interfacial anisotropy. The ferromagnetic material to which each gate electrode 101, 102 applies a field separately can be physically connected or can be separated forming one or multiple ferromagnetic electrodes. Key is to provide magnetic coupling between the in-plane magnet and the oblique magnet, such that obliquely oriented anisotropy fields are effectively applied by the two gates to an effective common magnetization (see FIGS. 5A-5E, which illustrate the working principle of the device). The device can be realized by tuning geometry (e.g. size and relative spatial position of the two electrodes and their relative angle), and/or tuning thicknesses of the films and stack structure (sequence of layers for each of the electrodes including ferromagnetic layers, magnetic material choice, making use of exchange, dipolar field, or other couplings), among other parameters.

The two gate electrodes 101, 102 control the magnetic anisotropy axis orientation of the ferromagnetic electrode 300 in each magnetic stack. The two gate electrodes 101, 102 control the magnetization orientation which corresponds to an energy minimum as a function of orientation of the magnetization of the ferromagnetic electrode 300. The two gate electrodes 101, 102 each control the strength of the energy minima as function of magnetization orientation of the ferromagnetic electrode 300 in two different orientations at an oblique angle 800 relative to one another. Oblique is defined here as an angle which is neither parallel (e.g., 0, 180 degrees, . . . ) nor normal (e.g., 90, 270 degrees). The optimal angle between the energy minima orientations controlled by the gates to obtain highest anisotropy torque is 45 degrees+ N×90 degrees with N being an integer number. The angle can deviate from 45 degrees for practical (manufacturing) purposes, e.g., by +/−2-5 degrees, +/−5-10 degrees, +/−10-15 degrees to name a few example ranges of deviation. The operation of the device will weaken and become ineffective as parallel or normal orientations are approached.

The double gate electrodes 101, 102 allow deterministic and fast control of the magnetization by means of voltage controlled magnetic anisotropy. For dealing with the symmetry limitation of the voltage controlled magnetic anisotropy for switching purposes, a variable symmetry breaking field may be introduced. For deterministic switching, this field does not need to be large and can be applied by an Oersted field or a strongly reduced spin torque current with as a consequence that we are compromising the voltage control low-power advantage of voltage controlled magnetic anisotropy and lowering the switching speed. The solution that is described in the present disclosure is to use a multiple gate VCMA device in which the (at least) two gate electrodes 101, 102 allow to control anisotropy with anisotropy axes at an oblique angle of −45° (or another oblique angle 800) to break the symmetry allowing deterministic switching. Simultaneously this allows maximizing the anisotropy field torque resulting in speeds significantly faster than allowed by spin torque transfer.

The general principle based on which the magnetic memory element of the present disclosure makes it possible to change memory state by means of voltage controlled magnetic anisotropy is illustrated schematically in the following with respect to FIGS. 5A-5E. The magnetization M is rotated by 180 degrees in stages of 45 degrees by applying a sequence of voltages to the two gate electrodes 101, 102.

FIG. 5A illustrates the magnetization orientations of the magnetic memory element in rest state. In the rest state (no voltages applied) the magnetization has two possible orientation directions. Preferably the anisotropy in the rest state is sufficiently large to guarantee the required thermal stability of the memory bit. As an example, the anisotropy axis in the rest state could be oriented normal to the plane. In this example, as illustrated with respect to FIG. 5A, the magnetization in the rest state is oriented either upward or downward, thereby determining the state of the memory. In the illustration (FIG. 5A) of the working principle of the disclosed memory device, the magnetization orientation will be changed from upward to downward. In the rest state, the anisotropy axis is normal to the plane (easy axis indicated by the thick interrupted line in FIG. 5A) and there is a small obliquely oriented anisotropy component (the thin interrupted line in FIG. 5A). The total anisotropy is dominated by the normal anisotropy axis.

FIG. 5B illustrates the magnetization orientations of the magnetic memory element after application of first voltage(s). In the first step (FIG. 5A to FIG. 5B), voltages are applied to the gates so the normal anisotropy component determined by gate 1 is strongly reduced and that the dominant anisotropy axis and easy axis becomes the obliquely oriented axis controlled by gate 2 (thick interrupted line in FIG. 5B). The resulting anisotropy torque can rotate the magnetization by 45 degrees significantly more quickly than for the normal or parallel oriented case. The direction of rotation is also controlled and not stochastic in nature (final state is fixed and no incubation period).

FIG. 5C illustrates the magnetization orientations of the magnetic memory element after application of second voltage(s). In the next stage, the magnetization is rotated by another 45 degrees by applying a different set of voltages to the gates which result in a negative Ku along the normal anisotropy axis and hence favors magnetization normal to the anisotropy axis and parallel to the plane. The obliquely oriented anisotropy controlled by gate 2 is low. The magnetization now turns in plane (FIG. 5C).

FIG. 5D illustrates the magnetization orientations of the magnetic memory element after application of third voltage(s). In the next step, voltages are applied to the gates so the anisotropy axis is oblique oriented with the easy direction normal to the anisotropy axis resulting in a magnetization orientation rotated by another 45 degrees.

FIG. 5E illustrates the magnetization orientations of the magnetic memory element after application of fourth voltage(s). In the final step the voltages are released returning to the rest state with normal anisotropy axis and with 180 degree rotated magnetization state. Throughout this magnetization reversal process the magnetization state is deterministically controlled and the anisotropy torque is maximal avoiding slow switching and incubation delays for normal or parallel oriented anisotropy torques. The same process can be applied to rotate the memory state back to the initial state. Such phase-wise switching by 45 degrees allows to increase torque and switching speed compared to the typical case in which anisotropy torque is applied at 0 or 90 degrees.

Figures 6A, 6B, 6C:
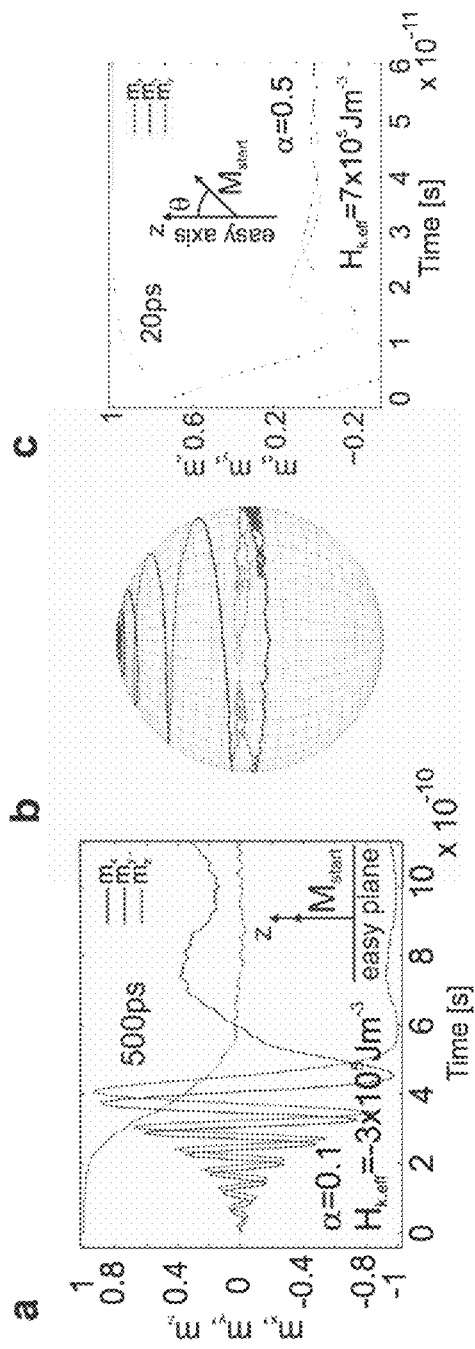
FIG. 6A shows a Langevin Landau Lifschitz Gilbert model calculation of anisotropy switching at a $\theta=0°$ starting angle. The switching shows a typical incubation period. $m_x$, $m_y$, $m_z$ are the x- y- and z-components of the orientation unit vector of magnetization.
FIG. 6B illustrates a polar plot of the calculation of FIG. 6A.
FIG. 6C illustrates a calculation of the switching process at $\theta=45°$.

Without being bound to any theory, Langevin Landau Lifschitz Gilbert (LLG) model calculations of the magnetization dynamics have been performed, whose results are shown in FIGS. 6A-6C to illustrate the speed advantages of the magnetic memory element according to the present disclosure. Oblique switching (FIG. 6C) making use of a magnet with higher damping and higher anisotropy can be more than an order of magnitude faster than switching by anisotropy inversion in a conventional stack (FIGS. 6A-6B) making use of parallel or normal anisotropy axis. By sequencing voltages across the double gates magnetization can be controlled deterministically at very high speeds (see FIG. 6C).

Figures 7A, 7B, 7C, 7D, 7E, 7F, 7G, 7H, 7I, 7J:
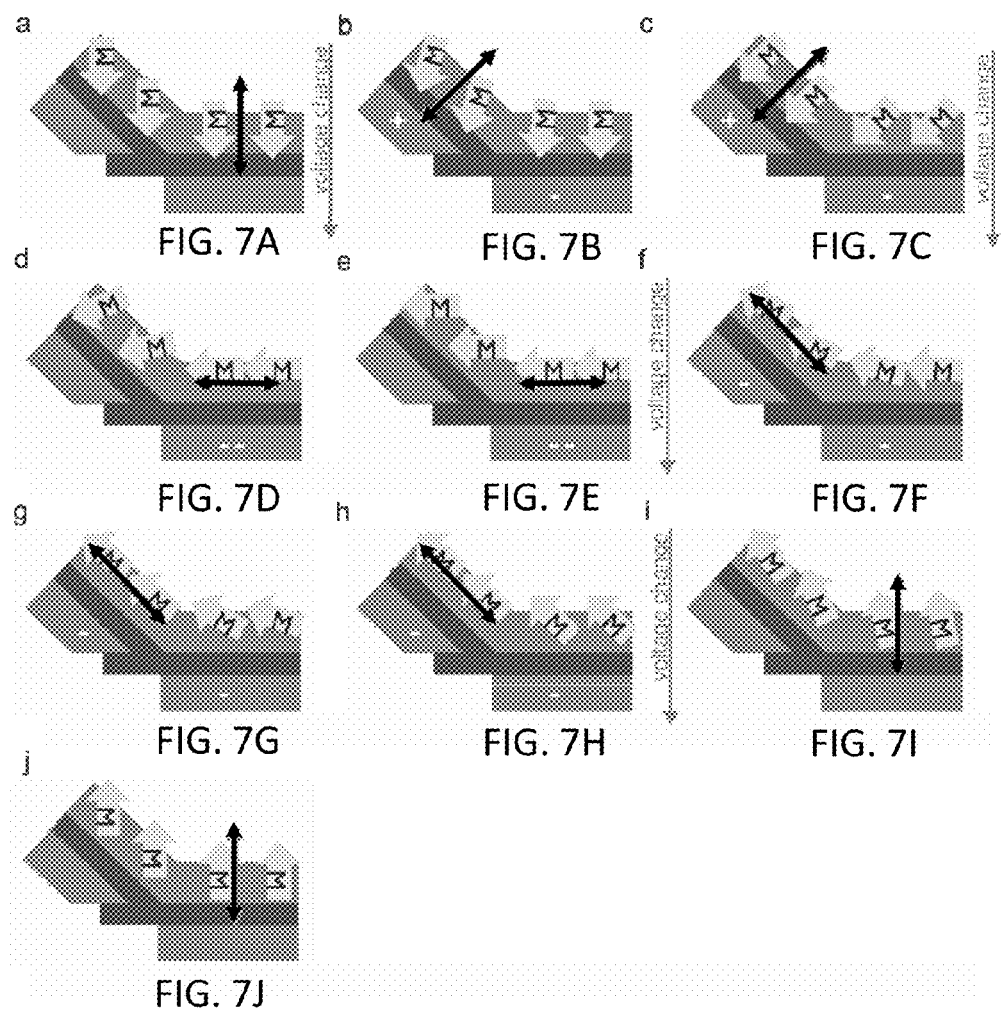
FIGS. 7A-7J show a simulation of magnetic switching in the first phase of the switching process depicted in FIGS. 5A-5B.

FIGS. 7A-7J show a more elaborate schematic representation of the VCMA switching behavior for a magnetic memory element according to embodiments of the present disclosure for the device shown in FIG. 4. The double-headed arrow indicates the easy axis or easy plane of the specific ferromagnetic layer. The thick arrows marked with M represent the magnetization direction. The schematic depicts how the bit is reversed by sequencing voltages (shown by the one-headed arrow) across the gates. The other ferromagnetic layer (area without double arrow) has low or no anisotropy. The rest state without any voltages is indicated in FIG. 7A. In this state either up or down magnetization is stable. A voltage is applied and the anisotropy responds immediately (electronic effect). The magnetization responds by rotating to align with the anisotropy FIG. 7B until it is completely aligned FIG. 7C. Further voltages are sequenced to completely rotate the bit FIGS. 7D-7J).

In FIGS. 8A-8J, a simulation of switching of an embodiment of the disclosed device depicted in FIG. 4 and FIG. 7 is shown. The simulation shows the stage of switching illustrated in FIGS. 5A-5B and FIGS. 7A-7C. In this embodiment, the exchange interaction aligns the spins (small arrows from which the main orientation is schematically shown by one large arrow) in the left part and right part of the ferromagnetic material. The left part of the ferromagnetic electrode is tilted by 45 degrees. Net anisotropy in the left slanted electrode is low and perpendicular net anisotropy is present in the right electrode. At the onset of the switching process the device is in the rest state and the magnetization is oriented upward. In the rest state the effective total anisotropy of the left part of the electrode is small and the right part has normal anisotropy. At the onset of switching, voltages are applied to the gate electrodes so the effective total anisotropy of the left part of the magnetic electrode becomes normal to the plane of that part and so the anisotropy of the right part of the electrode becomes small. The magnetization of the left part of the electrode will start rotating toward the anisotropy axis first and the exchange interaction will align the spins of the right part of the magnetic electrode. The left gate effectively exerts the effect of an oblique anisotropy axis on the entire electrode mediated by the exchange interaction. At time t=0 s, a bias is applied to the left electrode inducing perpendicular anisotropy in the left electrode. The right electrode is biased at a voltage corresponding to low net anisotropy. The remaining stages of the switching process will continue as illustrated in FIG. 5 and FIG. 7.

Figure 9:
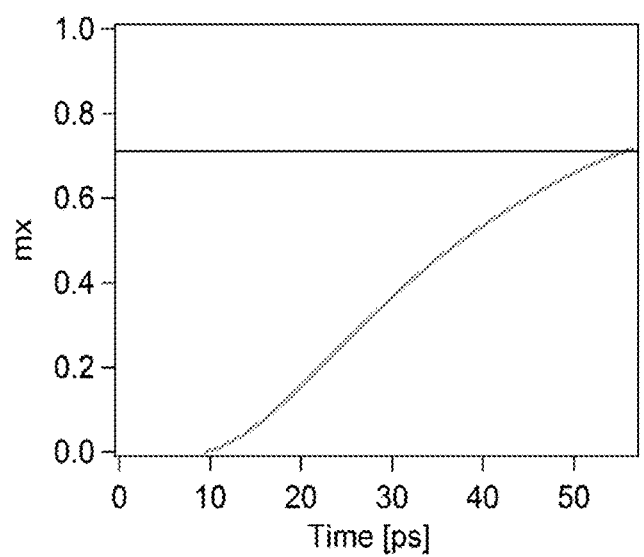
FIG. 9 shows normalized magnetization integrated over the entire magnet (both parts) in the horizontal x-direction ($m_x$) as a function of time corresponding to the simulation shown in FIG. 8.

FIG. 9 shows normalized magnetization integrated over the entire magnet (both parts) in the horizontal x-direction ($m_x$) as a function of time corresponding to the simulation shown in FIG. 8. This shows the high speed of the switching process for the magnetic memory element according to the present disclosure. Switching by 45 degrees is completed within 50 ps. The four stage process would then be completed in 200 ps.

At rest, without any voltages applied to the gates, the first magnetic stack may possess a large perpendicular magnetic anisotropy, sufficiently large to guarantee nonvolatile storage of a bit (0 or 1 depending on whether the magnetization points upward or downward compared to the plane of the stack) whereas the second magnetic stack possesses a small or negligible anisotropy.

To reverse the bit a first set of voltages are applied simultaneously to the gate electrodes of both magnetic stacks (one for each electrode) so that the anisotropy of the first magnetic stack turns negligible and so that the anisotropy of the second magnetic stack becomes large and perpendicular. This rotates the magnetization by approximately 45 degrees or an oblique angle at high speed.

Next, a set of voltages is applied to the gates so that the anisotropy of the first magnetic stack becomes large and in-plane whereas the anisotropy of the magnetic second stack becomes small. This rotates the magnetization by another (approximately) 45 degrees or an oblique angle.

Next, another set of voltages is applied to the gates so that the anisotropy of the first magnetic stack becomes small and negligible and the anisotropy of the second magnetic stack becomes large and in-plane. This rotates the magnetization by a further (approximately) 45 degrees or an oblique angle.

Finally, the voltages are released and set to zero, and the magnetic bit is now fully reversed. This reversal procedure works for an upward or downward magnetization orientation.

The magnetic bit is read by means of the TMR effect and by measuring the resistance between the free ferromagnetic layer of the magnetic stack electrode and the reference magnetic layer separated by an insulating barrier layer (such as MgO). According to various embodiments, one or both of the free ferromagnetic layer and the reference magnetic layer can comprise, e.g., CoFeB. When configured to be read using the TMR effect, the insulating barrier has a thickness that is sufficiently thin to be tunneled by electrons. For example, the insulating barrier formed of MgO may be less than, e.g., 2 nm.

Voltage controlled magnetic anisotropy is used to control the state of the memory bit. For readout a magnetoresistance effect can be used such as the tunneling magnetoresistance (TMR) effect or the giant magnetoresistive (GMR) effect. In order to be able to readout the state of the memory bit either one of the gates used to control the magnetic anisotropy can be used by using the TMR effect which affects the tunneling current between the ferromagnet through the dielectric into the gate electrode which would be ferromagnetic as well in this case. Alternatively, a(n) extra electrode(s) can be added to sense the state of the memory bit by means of GMR or TMR.

Additional layers of ferromagnetic or non-magnetic materials can be added to the device in order to tune the VCMA effect, the magnetic damping of the storage layer, stray fields, thermal stability, magnetic anisotropy and properties of the readout elements in order to obtain an optimally functioning, high performing device operating in a circuit.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A magnetic memory, comprising:
    a first magnetic stack comprising a first gate dielectric layer formed between a first gate electrode and a first free ferromagnetic layer; and
    a second magnetic stack comprising a second gate dielectric layer formed between a second gate electrode and a second free ferromagnetic layer,
    wherein the first free ferromagnetic layer and the second free ferromagnetic layer are magnetically coupled, contiguous and are positioned at an oblique angle relative to each other, and
    wherein the first gate electrode and the second gate electrode are electrically isolated from each other.

2. The magnetic memory according to claim 1, wherein the first free ferromagnetic layer and the second free ferromagnetic layer comprise the same ferromagnetic material stack.

3. The magnetic memory according to claim 1, wherein the first gate dielectric layer and the second gate dielectric layer are contiguous and are positioned at the oblique angle relative to each other.

4. The magnetic memory according to claim 1, wherein the first gate electrode and the second gate electrode are electrically isolated from each other by the first gate dielectric layer or the second gate dielectric layer.

5. The magnetic memory according to claim 1, wherein the oblique angle is about 45 degrees+n times 90, with n is a natural number.

6. A voltage-controlled magnetic anisotropy (VCMA) device comprising the magnetic memory of claim 1, wherein the VCMA device is configured to control a magnetic anisotropy of the first magnetic stack by applying a first voltage the first gate electrode, thereby switching a first magnetic orientation of the first free ferromagnetic layer 701, and wherein the VCMA device is configured to control a second magnetic anisotropy of the second magnetic stack by applying a second voltage to the second gate electrode, thereby switching a second magnetization orientation of the free ferromagnetic layer.

7. The voltage-controlled magnetic anisotropy (VCMA) device according to claim 6, further comprising a fixed ferromagnetic layer formed on top or beneath the first free ferromagnetic layer and/or the second free ferromagnetic layer, wherein a barrier layer is formed between the fixed ferromagnetic layer and the first free ferromagnetic layer and the second free ferromagnetic layer.

8. The voltage-controlled magnetic anisotropy (VCMA) device according to claim 7, wherein when no voltages are applied to the first and second gate electrodes, the first magnetic gate stack possesses a sufficiently large perpendicular magnetic anisotropy for nonvolatile storage of a bit, whereas the second magnetic stack possesses an insufficient perpendicular magnetic anisotropy for storage of a bit.

9. A method for reversing the bit of a voltage-controlled magnetic anisotropy (VCMA) device according to claim 6, the method comprising:
    applying a first set of voltages simultaneously to the first and second gate electrodes for rotating the magnetization by a first oblique angle within 0-90 degrees;
    applying a second set of voltages simultaneously to the first and second gate electrode for rotating the magnetization by a second oblique angle within 0-90 degrees;
    applying a third set of voltages simultaneously to the first and second gate electrodes for rotating the magnetization by a third oblique angle within 0-90 degrees; and
    setting the voltages to the first and second gate electrode to their initial values prior to the application of the first set of voltages.

10. The method for reversing the bit of a voltage-controlled magnetic anisotropy (VCMA) device according to claim 9, wherein applying a first set of voltages simultaneously to the first and second gate electrode induces changing the anisotropy of the second magnetic stack to become large and perpendicular and wherein applying a second set of voltages simultaneously to the first and second gate electrode induces changing the anisotropy of the first gate magnetic stack to become large and in-plane and changing the anisotropy of the second gate magnetic stack to become small and wherein applying the third set of voltages simultaneously to the first and second gate electrode induces changing the anisotropy of the first gate magnetic stack to become small and changing the anisotropy of the second gate magnetic stack to become large and in-plane and wherein setting the voltages to the first and second gate electrode to their initial values induces the first ferromagnetic electrode to return to its initial strong perpendicular anisotropy and the second ferromagnetic electrode to return to its initial weak anisotropy.

11. The method for reading the bit of a voltage-controlled magnetic anisotropy (VCMA) device according to claim 6, wherein the VCMA device further comprises a fixed ferromagnetic layer formed on top or beneath the first free ferromagnetic layer and/or the second free ferromagnetic layer, wherein a barrier layer is formed between the fixed ferromagnetic layer and the first free ferromagnetic layer and the second free ferromagnetic layer, wherein the method comprises measuring the resistance between the first free ferromagnetic electrode and the fixed ferromagnetic electrode.

12. The magnetic memory of claim 1, wherein the first gate electrode and second gate electrode are stacked over a substrate in a vertical direction and are interposed by the first gate dielectric layer in the vertical direction.

13. The magnetic memory of claim 12, wherein the second gate electrode comprises a facet having a normal direction which forms an oblique angle with respect to the vertical direction.

14. The magnetic memory of claim 13, wherein the first and second free ferromagnetic layers are portions of the same ferromagnetic layer.

15. The magnetic memory of claim 14, wherein the facet of the second gate electrode and the second free ferromagnetic layer are interposed by the second dielectric layer.

16. The magnetic memory of claim 15, wherein the first and second dielectric layers are formed of MgO having a thickness less than 2 nm.

* * * * *